United States Patent
Lafarre et al.

(10) Patent No.: US 8,902,400 B2
(45) Date of Patent: Dec. 2, 2014

(54) LITHOGRAPHIC APPARATUS AND A METHOD OF MANUFACTURING A DEVICE USING A LITHOGRAPHIC APPARATUS

(75) Inventors: Raymond Wilhelmus Louis Lafarre, Helmond (NL); Michel Riepen, Veldhoven (NL); Rogier Hendrikus Magdalena Cortie, Ittervoort (NL); Ralph Joseph Meijers, Kerkrade (NL); Fabrizio Evangelista, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 694 days.

(21) Appl. No.: 13/039,072

(22) Filed: Mar. 2, 2011

(65) Prior Publication Data

US 2011/0216292 A1 Sep. 8, 2011

Related U.S. Application Data

(60) Provisional application No. 61/310,432, filed on Mar. 4, 2010.

(51) Int. Cl.
*G03B 27/52* (2006.01)

(52) U.S. Cl.
CPC ..................... *G03B 27/52* (2013.01)
USPC ............................................. 355/30; 355/53

(58) Field of Classification Search
CPC ........... G03B 27/52; G03B 3/06; G03B 7/709
USPC ....................................................... 355/30, 53
See application file for complete search history.

(56) References Cited

U.S. PATENT DOCUMENTS

| | | | |
|---|---|---|---|
| 4,509,852 A | 4/1985 | Tabarelli et al. | |
| 6,952,253 B2 | 10/2005 | Lof et al. | |
| 7,119,874 B2 | 10/2006 | Cox et al. | |
| 8,144,305 B2 | 3/2012 | Leenders et al. | |
| 8,345,218 B2 | 1/2013 | Riepen et al. | |
| 2004/0136494 A1 | 7/2004 | Lof et al. | |
| 2004/0207824 A1 | 10/2004 | Lof et al. | |
| 2005/0018155 A1* | 1/2005 | Cox et al. | 355/30 |
| 2006/0038968 A1 | 2/2006 | Kemper et al. | |
| 2006/0119809 A1 | 6/2006 | Verhagen et al. | |
| 2006/0232756 A1* | 10/2006 | Lof et al. | 355/53 |

(Continued)

FOREIGN PATENT DOCUMENTS

| | | |
|---|---|---|
| EP | 1420300 | 5/2004 |
| JP | 2007-201384 | 8/2007 |

(Continued)

OTHER PUBLICATIONS

Chinese Office Action dated Jan. 18, 2013 in corresponding Chinese Patent Application No. 201110052100.5.

*Primary Examiner* — Mesfin T Asfaw
(74) *Attorney, Agent, or Firm* — Pillsbury Winthrop Shaw Pittman LLP

(57) ABSTRACT

A liquid handling structure for a lithographic apparatus comprises a droplet controller configured to allow a droplet of immersion liquid to be lost from the structure and to prevent the droplet from colliding with the meniscus of the confined immersion liquid. The droplet controller may comprise gas knives arranged to overlap to block an incoming droplet. There may be extraction holes lined up with gaps between gas knives to extract liquid that passes through the gap. A droplet is allowed to escape through the gaps.

15 Claims, 8 Drawing Sheets

(56) References Cited

U.S. PATENT DOCUMENTS

| | | |
|---|---|---|
| 2007/0268466 A1 | 11/2007 | Leenders et al. |
| 2008/0212046 A1 | 9/2008 | Riepen et al. |
| 2009/0262318 A1 | 10/2009 | Van Den Dungen et al. |
| 2009/0279060 A1 | 11/2009 | Direcks et al. |
| 2009/0279062 A1 | 11/2009 | Direcks et al. |
| 2009/0279063 A1 | 11/2009 | Riepen et al. |
| 2010/0085545 A1 | 4/2010 | Direcks et al. |

FOREIGN PATENT DOCUMENTS

| | | |
|---|---|---|
| JP | 2007-318117 | 12/2007 |
| JP | 2009-188241 | 8/2009 |
| JP | 2009-260343 | 11/2009 |
| JP | 2009-272635 | 11/2009 |
| JP | 2009-272636 | 11/2009 |
| JP | 2009-272640 | 11/2009 |
| JP | 2010-034555 | 2/2010 |
| JP | 2011-134776 | 7/2011 |
| TW | 200426521 | 12/2004 |
| TW | 200507049 | 2/2005 |
| TW | 200951642 | 12/2009 |
| WO | 99/49504 | 9/1999 |
| WO | 2005/064405 | 7/2005 |

\* cited by examiner

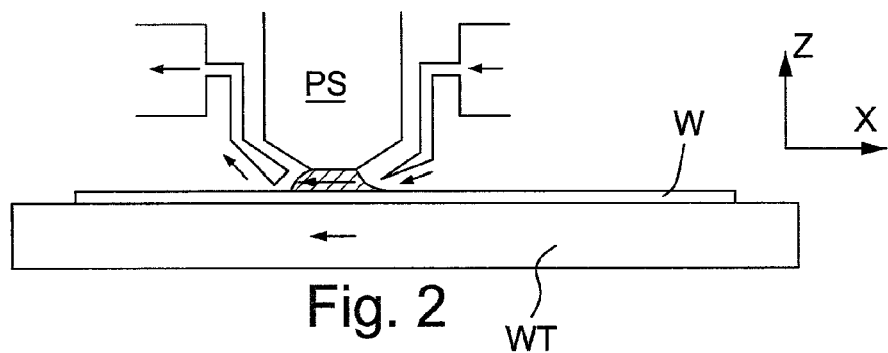
Fig. 2
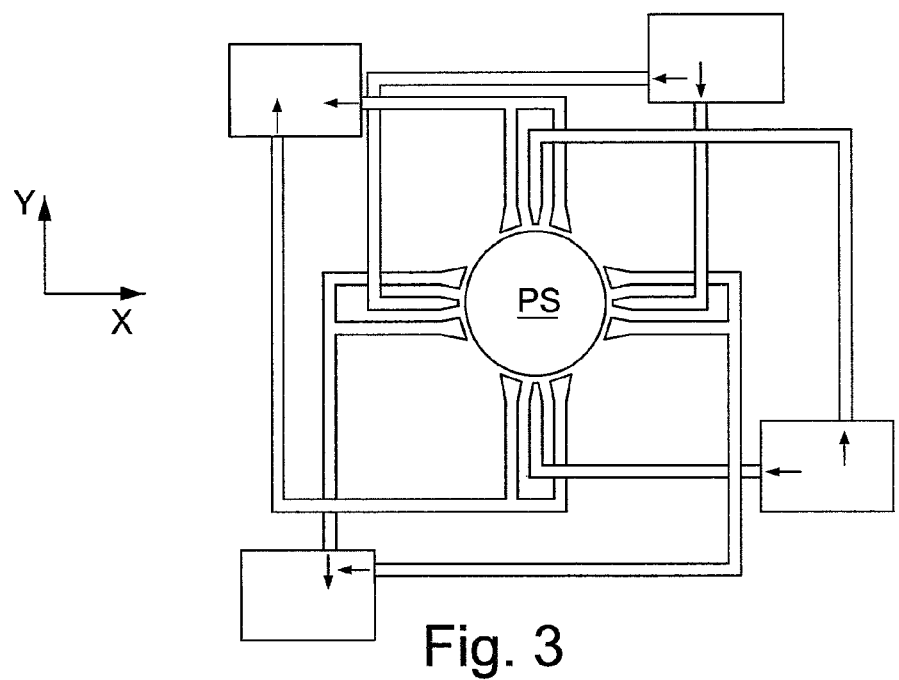
Fig. 3
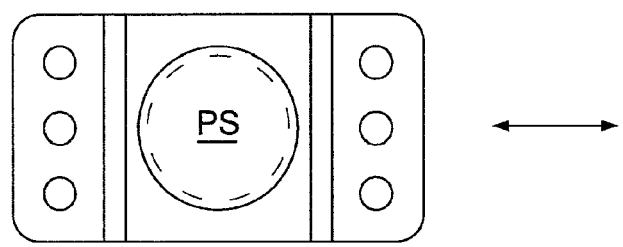
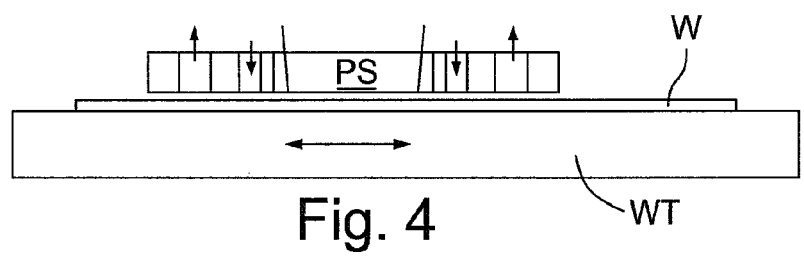
Fig. 4

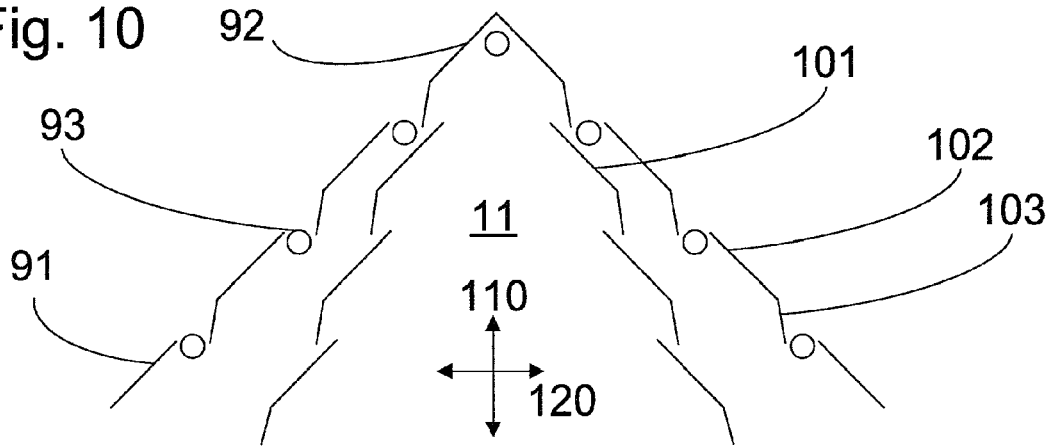
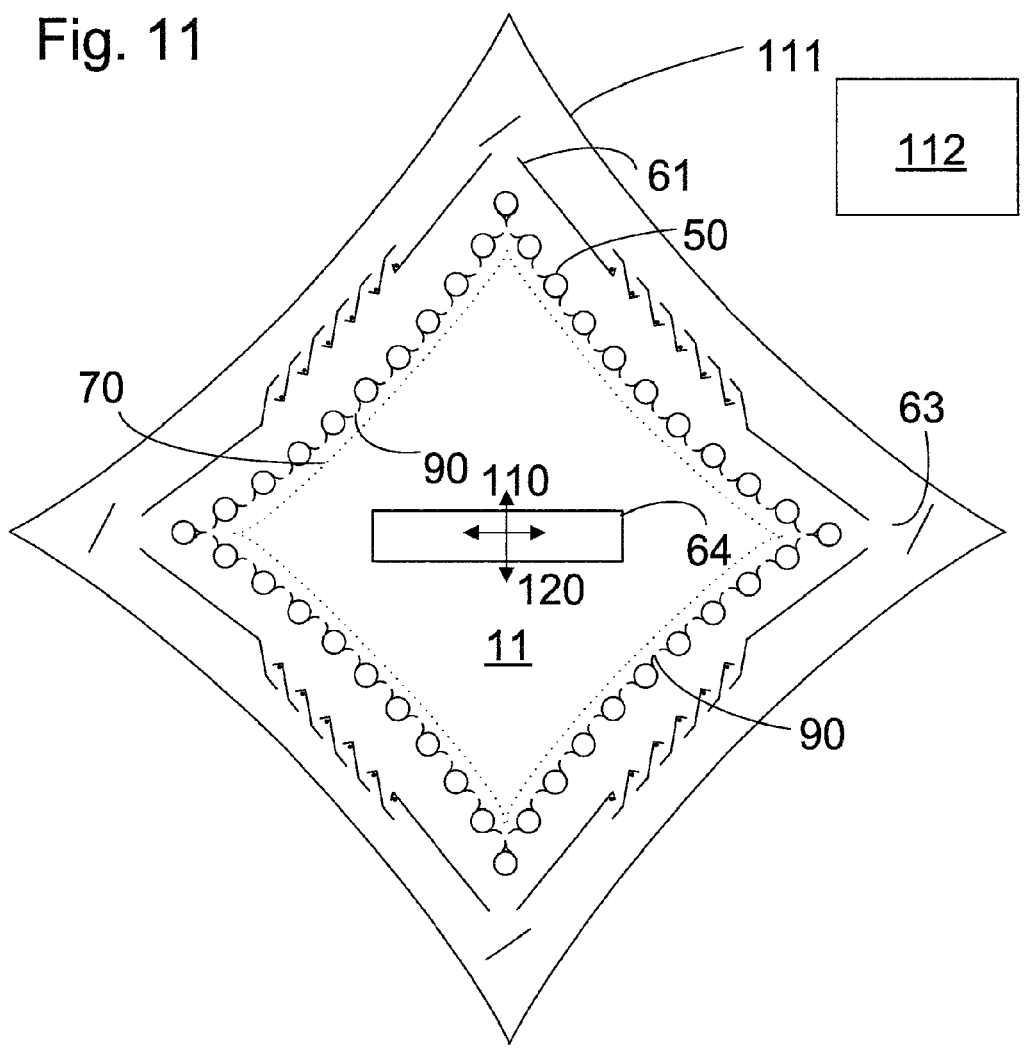

LITHOGRAPHIC APPARATUS AND A METHOD OF MANUFACTURING A DEVICE USING A LITHOGRAPHIC APPARATUS

This application claims priority and benefit under 35 U.S.C. §119(e) to U.S. Provisional Patent Application No. 61/310,432, entitled "A Lithographic Apparatus and A Method Of Manufacturing A Device Using A Lithographic Apparatus", filed on Mar. 4, 2010. The content of that application is incorporated herein in its entirety by reference.

FIELD

The present invention relates to a lithographic apparatus and a method of manufacturing a device using a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a liquid handling system, device, structure or apparatus. In an embodiment the liquid handling structure may supply immersion fluid and therefore be a fluid supply system. In an embodiment the liquid handling structure may at least partly confine immersion fluid and thereby be a fluid confinement system. In an embodiment the liquid handling structure may provide a bather to immersion fluid and thereby be a barrier member, such as a fluid confinement structure. In an embodiment the liquid handling structure may create or use a flow of gas, for example to help in controlling the flow and/or the position of the immersion fluid. The flow of gas may form a seal to confine the immersion fluid so the liquid handling structure may be referred to as a seal member; such a seal member may be a fluid confinement structure. In an embodiment, immersion liquid is used as the immersion fluid. In reference to the aforementioned description, reference in this paragraph to a feature defined with respect to fluid may be understood to include a feature defined with respect to liquid.

SUMMARY

In immersion lithography some liquid may be lost from the space onto a substrate being exposed or the substrate table supporting the substrate. The lost liquid may pose a defectivity risk. For example, a droplet of liquid present on the surface, such as of the substrate or substrate table, which later collides with liquid in the space, for example the meniscus of the liquid, may cause the formation of a volume of gas, such as a bubble within the space. The bubble may interfere with imaging radiation directed towards a target portion of the substrate to affect the imaged pattern on the substrate.

It is desirable, for example, to reduce or eliminate the risk of such or other imaging defects. It may be desirable to maintain or even increase through-put.

According to an aspect, there is provided an immersion lithographic apparatus comprising a liquid handling structure configured to supply and confine immersion liquid to a space between a projection system and a facing surface comprising a table, or a substrate supported by the table, or both the table and the substrate, and a droplet controller radially outward of the space configured to allow a droplet of immersion liquid to pass from radially inward of the droplet controller to radially outward of the droplet controller and to prevent a droplet from passing from radially outward of the droplet controller to radially inward of the droplet controller.

According to an aspect, there is provided an immersion lithographic apparatus comprising a liquid handling structure configured to supply and confine immersion liquid to a space between a projection system and a facing surface comprising a table, or a substrate supported by the table, or both the table and the substrate; and a plurality of elongate gas outlet openings radially outward of the space configured to direct a gas flow toward the facing surface, wherein an adjacent pair of the elongate gas outlet openings overlap when viewed in a scanning direction of the facing surface and/or when viewed in a direction perpendicular to the scanning direction.

According to an aspect, there is provided an immersion lithographic apparatus comprising: a liquid handling structure configured to supply and confine immersion liquid to a space between a projection system and a facing surface comprising a table, or a substrate supported by the table, or both the table and the substrate; and a droplet controller radially outward of the space, the droplet controller comprising: a plurality of elongate gas outlet openings configured to direct a gas flow toward the facing surface; and a plurality of liquid extraction openings, each liquid extraction opening lined up, with respect to a scanning direction and/or a stepping direction of the facing structure, with a respective gap between adjacent elongate gas outlet openings.

According to an aspect, there is provided a method of manufacturing a device using a lithographic apparatus, the method comprising: confining liquid using a confinement structure in a space between a projection system and a facing surface of a table, a substrate supported by the table, or both the table and the substrate; moving the facing surface relative to the projection system in a scanning direction; and manipulating a droplet of immersion liquid by: allowing the droplet to pass from radially inward of a droplet controller to radially outward of the droplet controller, wherein the droplet controller is radially outward of the space; and preventing the droplet from passing from radially outward of the droplet controller to radially inward of the droplet controller.

According to an aspect, there is provided a method of manufacturing a device using a lithographic apparatus, the method comprising: confining liquid using a confinement structure in a space between a projection system and a facing surface of a table, a substrate supported by the table, or both the table and the substrate; moving the facing surface relative to the projection system in a scanning direction; and directing a gas flow toward the facing surface through a plurality of elongate gas outlet openings radially outward of the space, wherein an adjacent pair of the elongate gas outlet openings overlap when viewed in the scanning direction of the facing surface and/or when viewed in a direction perpendicular to the scanning direction.

According to an aspect, there is provided a method of manufacturing a device using a lithographic apparatus, the method comprising: confining liquid using a confinement structure in a space between a projection system and a facing surface of a table, a substrate supported by the table, or both the table and the substrate; moving the facing surface relative to the projection system in a scanning direction; and manipulating a droplet of immersion liquid by: directing a gas flow toward the facing surface from a plurality of elongate gas outlet openings having a gap between them; and extracting at least a part of the droplet through a plurality of liquid extraction openings, each liquid extraction opening lined up, with respect to the scanning direction, with a respective gap between adjacent elongate gas outlet openings.

According to an aspect, there is provided a fluid handling structure for an immersion lithographic apparatus, the fluid handling structure configured to supply and confine immersion liquid to a space between a projection system and a facing surface comprising a table, or a substrate supported by the table, or both the table and the substrate, the liquid forming a meniscus between a surface of the fluid handling structure and the facing surface, the fluid handling structure comprising a droplet controller to prevent liquid on the facing surface from reaching the meniscus.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic projection apparatus;

FIG. 4 depicts a further liquid supply system for use in a lithographic projection apparatus;

FIG. 10 depicts, in plan, part of a liquid handling structure according to an embodiment of the invention;

FIG. 11 depicts, in plan, a liquid handling structure according to an embodiment of the invention.

DETAILED DESCRIPTION

Figure 1:
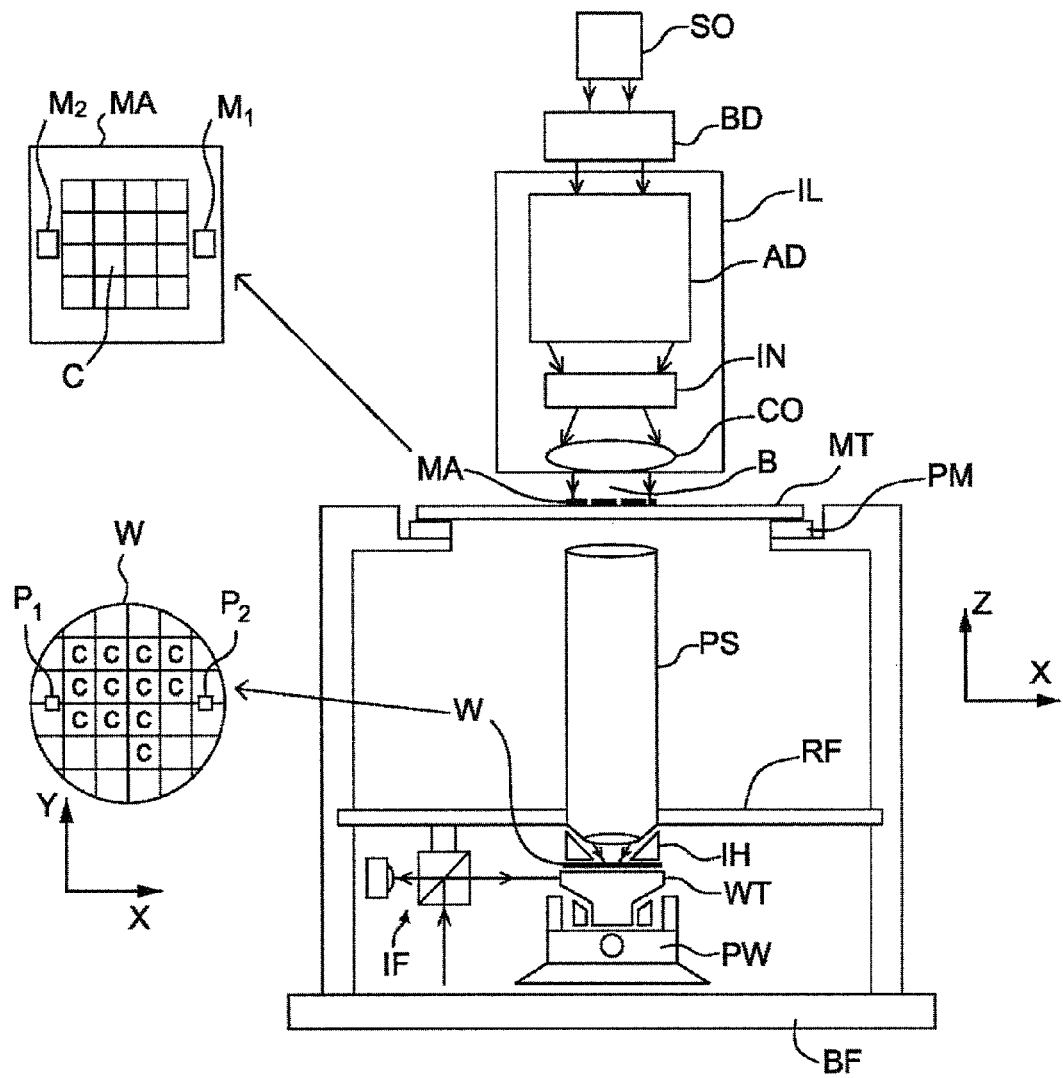
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a substrate table (e.g. a wafer table) WT constructed to hold a substrate (e.g. a resist-coated wafer) W and connected to a second positioner PW configured to accurately position the substrate W in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or embodiments on the above described modes of use or entirely different modes of use may also be employed.

Arrangements for providing liquid between a final element of the projection system and the substrate can be classed into at least two general categories. These are the bath type arrangement and the so-called localized immersion system. In the bath type arrangement substantially the whole of the substrate and optionally part of the substrate table is submersed in a bath of liquid. The so-called localized immersion system uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area. Four different types of localized liquid supply systems are illustrated in FIGS. 2-5.

One of the arrangements proposed is for a liquid supply system to provide liquid on only a localized area of the substrate and in between the final element of the projection system and the substrate using a liquid confinement system (the substrate generally has a larger surface area than the final element of the projection system). One way that has been proposed to arrange for this is disclosed in PCT Patent Application Publication No. WO 99/49504. As illustrated in FIGS. 2 and 3, liquid is supplied by at least one inlet onto the substrate, desirably along the direction of movement of the substrate relative to the final element, and is removed by at least one outlet after having passed under the projection system. That is, as the substrate is scanned beneath the element in a –X direction, liquid is supplied at the +X side of the element and taken up at the –X side. FIG. 2 shows the arrangement schematically in which liquid is supplied via inlet and is taken up on the other side of the element by outlet which is connected to a low pressure source. The arrows above the substrate W illustrate the direction of liquid flow, and the arrow below the substrate W illustrates the direction of movement of the substrate table. In the illustration of FIG. 2 the liquid is supplied along the direction of movement of the substrate relative to the final element, though this does not need to be the case. Various orientations and numbers of in-and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and outlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). In the cross-sectional view of FIG. 4, arrows illustrate the direction of liquid flow in inlets and out of outlets.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

PCT patent application publication WO 2005/064405 discloses an all wet arrangement in which the immersion liquid is unconfined. In such a system the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the region between the final element of the projection system and the substrate. That liquid is allowed to leak (or flow) over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate in all positions and which is arranged to have immersion liquid extending between it and the top surface of the substrate and/or substrate table which holds the substrate.

Figure 5:
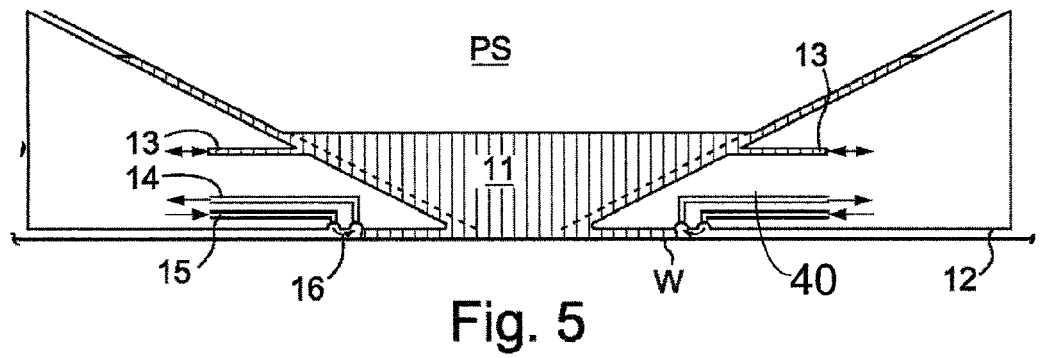
FIG. 5 depicts a further liquid supply system for use in a lithographic projection apparatus.

Another arrangement which has been proposed is to provide the liquid supply system with a fluid confinement structure. The fluid confinement structure may extend along at least a part of a boundary of the space between the final element of the projection system and the substrate table. Such an arrangement is illustrated in FIG. 5. The fluid confinement structure is substantially stationary relative to the projection system in the XY plane though there may be some relative movement in the Z direction (in the direction of the optical axis). A seal is formed between the fluid confinement structure and the surface of the substrate. In an embodiment, a seal is formed between the fluid confinement structure and the surface of the substrate and may be a contactless seal such as a gas seal. Such a system is disclosed in United States patent application publication no. US 2004-0207824. In another embodiment the fluid confinement structure has a seal which is a non-gaseous seal, and so may be referred to as a liquid confinement structure.

FIG. 5 schematically depicts a localized liquid supply system or liquid handling structure 12 or device with a body forming a barrier member or fluid confinement structure, which extends along at least a part of a boundary of the space 11 between the final element of the projection system PS and the substrate table WT or substrate W. (Please note that reference in the following text to surface of the substrate W also refers in addition or in the alternative to a surface of the substrate table WT, unless expressly stated otherwise.) The liquid handling structure is substantially stationary relative to the projection system PS in the XY plane though there may be some relative movement in the Z direction (in the direction of the optical axis). In an embodiment, a seal is formed between the liquid handling structure 12 and the surface of the substrate W and may be a contactless seal such as a gas seal or fluid seal.

The liquid handling structure 12 at least partly contains liquid in the space 11 between a final element of the projection system PS and the substrate W. A contactless seal, such as a gas seal 16, to the substrate W may be formed around the image field of the projection system PS so that liquid is confined within the space 11 between the substrate W surface and the final element of the projection system PS. The space 11 is at least partly formed by the liquid handling structure 12 positioned below and surrounding the final element of the projection system PS. Liquid is brought into the space 11 below the projection system PS and within the liquid handling structure 12 by liquid inlet 13. The liquid may be removed by liquid outlet 13. The liquid handling structure 12 may extend a little above the final element of the projection system PS. The liquid level rises above the final element so that a buffer of liquid is provided. In an embodiment, the liquid handling structure 12 has an inner periphery that at the upper end closely conforms to the shape of the projection system PS or the final element thereof and may, e.g., be round. At the bottom, the inner periphery closely conforms to the shape of the image field, e.g., rectangular, though this need not be the case. The inner periphery may be any shape, for example the inner periphery may conform to the shape of the final element of the projection system. The inner periphery may be round.

The liquid is contained in the space 11 by the gas seal 16, which, during use, is formed between the bottom of the liquid handling structure 12 and the surface of the substrate W. The gas seal 16 is formed by gas, e.g. air or synthetic air but in an embodiment, $N_2$ or another inert gas. The gas in the gas seal 16 is provided under pressure via inlet 15 to the region between liquid handling structure 12 and substrate W. The gas is extracted via outlet 14. The overpressure on the gas inlet 15, vacuum level on the outlet 14 and geometry of the region are arranged so that there is a high-velocity gas flow inwardly that confines the liquid. The force of the gas on the liquid between the liquid handling structure 12 and the substrate W contains the liquid in a space 11. The inlets/outlets may be annular grooves which surround the space 11. The annular grooves may be continuous or discontinuous. The flow of gas is effective to contain the liquid in the space 11. Such a system is disclosed in United States patent application publication no. US 2004-0207824.

The example of FIG. 5 is a so-called localized area arrangement in which liquid is only provided to a localized area of the top surface of the substrate W at any one time. Other arrangements are possible, including liquid handling structures that make use of a single-phase extractor or a two-phase extractor as disclosed, for example, in United States patent application publication no US 2006-0038968. In an embodiment, a single- or two-phase extractor may comprise an inlet that is covered in a porous material. In an embodiment of a single phase extractor the porous material is used to separate liquid from gas to enable single-phase liquid extraction. A chamber downstream of the porous material is maintained at a slight under pressure and is filled with liquid. The under pressure in the chamber is such that the meniscuses formed in the holes of the porous material prevent ambient gas from being drawn into the chamber. However, when the porous surface comes into contact with liquid there is no meniscus to restrict flow and the liquid can flow freely into the chamber. The porous material has a large number of small holes, e.g. of diameter in the range of 5 to 300 μm, desirably 5 to 50 μm. In an embodiment, the porous material is at least slightly liquidphilic (e.g., hydrophilic), i.e. having a contact angle of less than 90° to the immersion liquid, e.g. water.

Many other types of liquid supply system are possible. The present invention is not limited to any particular type of liquid supply system. The present invention may be advantageous for use with a confined immersion system in which the liquid between the final element of the projection system and the substrate is confined, for example, in optimizing the use. However, the invention can be used with any other type of liquid supply system.

Figure 6:
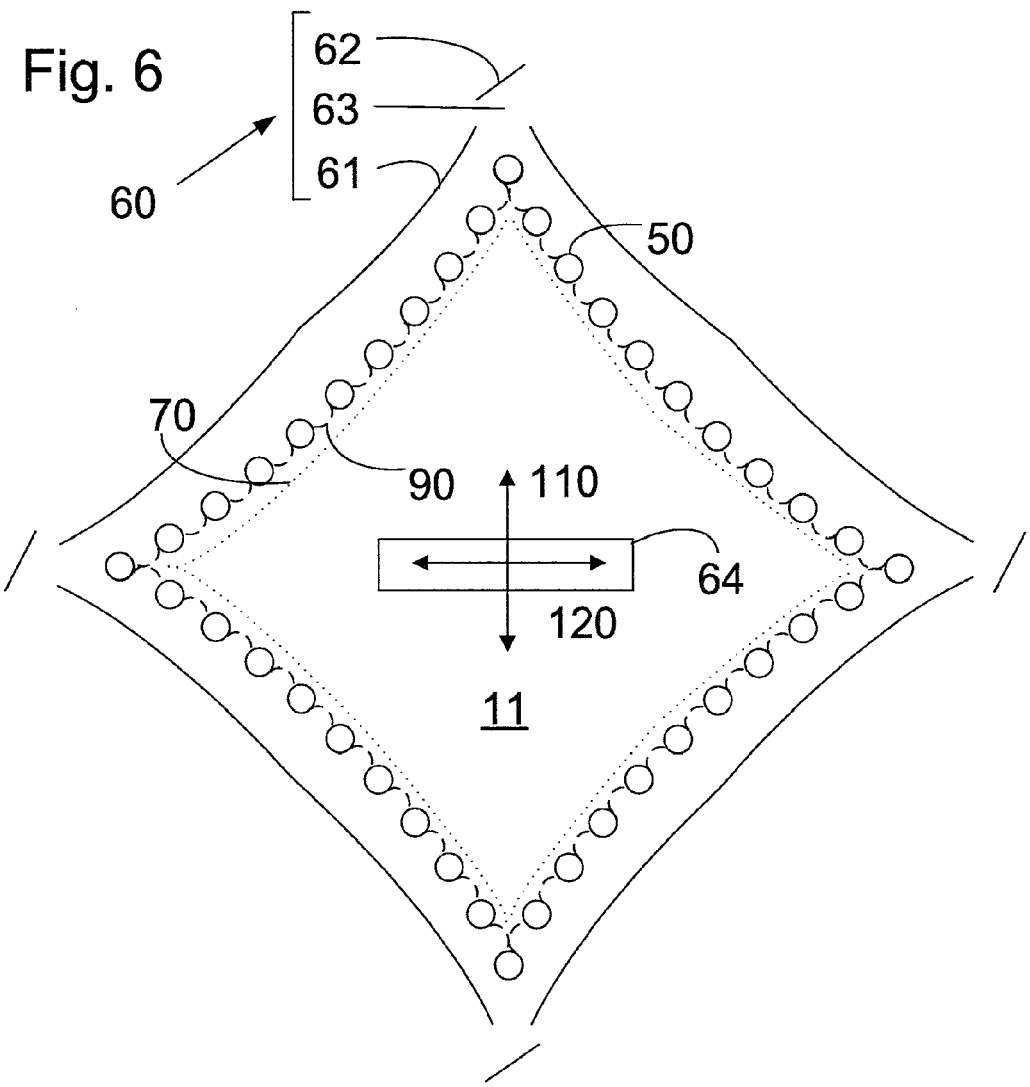
FIG. 6 depicts, in plan, a liquid handling structure according to an embodiment of the invention.

FIG. 6 illustrates a meniscus pinning device of an embodiment of the present invention which may, for example, replace the seal arrangement 14, 15, 16 of FIG. 5. The meniscus pinning device of FIG. 6 comprises a plurality of (extraction) openings 50. Each opening is discrete. Each opening 50 is illustrated as being circular though this is not necessarily the case. Indeed the shape of one or more of the openings 50 may be one or more selected from a square, a circle, a rectilinear shape, a rectangle, an oblong, a triangle, an elongate shape such as a slit, etc. Each opening 50 has, in plan, a large maximum cross-sectional dimension, such as a diameter, perhaps with a maximum dimension of greater than 0.5 mm, desirably greater than 1 mm. Desirably, the openings 50 are unlikely to be affected much by contamination.

Each of the openings 50 of the meniscus pinning device of FIG. 6 may be connected to a separate under pressure source. Alternatively or additionally, each or a plurality of the openings 50 may be connected to a common chamber (which may be annular) which is itself held at an under pressure. In this way a uniform under pressure at each or a plurality of the openings 50 may be achieved. The openings 50 can be connected to a vacuum source and/or the atmosphere surrounding the liquid supply system may be increased in pressure to generate the under pressure.

Each opening 50 is designed to extract a mixture of liquid and gas, for example in a two-phase flow. The liquid is extracted from the space 11 whereas the gas is extracted from the atmosphere on the other side of the openings 50 to the liquid. This creates a gas flow as illustrated by arrows 16. This gas flow is effective to pin the meniscus 90 between the openings 50 substantially in place as illustrated in FIG. 6, for example between neighboring openings 50. The gas flow helps maintain the liquid confined by momentum blocking, by a gas flow induced pressure gradient and/or by drag (shear) of the gas flow on the liquid.

As can be seen from FIG. 6, the openings 50 are positioned so as to form, in plan, a polygonal shape. In the case of FIG. 6 this is in the shape of a rhombus with the principal axes 110, 120 aligned with the major directions of travel of the substrate W under the projection system PS. This helps ensure that the maximum scan speed is faster than if the openings 50 were arranged in a circular shape. This is because the force on the meniscus between two openings 50 is reduced with a factor $\cos \theta$, where $\theta$ is the angle of the line connecting the two openings 50 relative to the direction in which the substrate W is moving. Thus, throughput can be optimized by having the primary axis 110 of the shape of the openings 50 aligned with the major direction of travel of the substrate (usually the scan direction) and to have a second axis 120 aligned with the other major direction of travel of the substrate (usually the step direction). The maximum scan speed is the maximum speed of the liquid handling structure 12 relative to the substrate W at which the meniscus 90 maintains its stability. Above the maximum scan speed, the meniscus is no longer stable and there may be catastrophic liquid loss. FIG. 11 depicts an arrangement having an additional outer gas (e.g., air) knife 111. This gas knife helps prevent liquid loss. As such, the arrangement depicted in FIG. 11 may be used at a speed greater than the maximum scan speed.

Further details of the openings 50 and the liquid handling structure 12 can be found in United States Patent Application Publication Nos. US 2008/0212046, US 2009-0279060, and US 2009-0279062, which are hereby incorporated by reference in their entirety.

In an embodiment formed in the undersurface 40 is a further opening 70. The further opening 70 in use is arranged to supply liquid from the liquid handling structure 12. The further opening 70 may be considered an outlet to supply liquid, such as immersion liquid, from the liquid handling structure 12. The further opening 70 may be referred to as an inlet to supply liquid into the space 11. The further opening 70 is radially inwardly, with respect to the optical axis of the projection system PS, of the extraction openings 50. The liquid exiting the further opening 70 of the liquid handling structure 12 is directed towards the substrate W. This type of further opening 70 is provided in order to reduce the chances of bubbles being generated in the immersion liquid. Gas may become trapped in a region between the edge of the substrate W and the substrate table WT. At an advance part of the undersurface of the liquid handling structure 12 relative to the substrate/substrate table, the facing surface of the substrate W and/or substrate table WT may be moving sufficiently fast relative to the liquid handling structure 12 such that liquid is unable to flow from the space 11 to the openings 50. A portion of the undersurface of the liquid handling structure 12 may become de-wetted, affecting the effectiveness of the meniscus pinning of the openings 50. Supplying liquid through the further opening 70, desirably near the openings 50, thereby reduces the risk of bubble inclusion and de-wetting.

The geometry of the further opening 70 has an impact upon the effectiveness of the liquid handling structure 12 in containing liquid. It is desirable that the further opening 70 has a shape, in plan that is cornered, like the shape of the openings 50, in plan. Indeed, the cornered shapes of the further opening 70 and openings 50 are desirably substantially similar. In an embodiment, each shape has, at the apex of each corner, a further opening 70 or opening 50. Desirably, in an embodiment, the further opening 70 is within 10 mm, desirably 5 mm of an opening 50. That is, all parts of the shape made by the openings 50 are within 10 mm of a part of the shape made by the further opening 70. In an embodiment, further opening 70 comprises a plurality of further openings 70.

Further details regarding the extraction openings 50 and further opening 70 may be found in United States Patent Application Publication No. US 2009-0279060, which is hereby incorporated by reference.

Some liquid may be lost from the space 11 onto the substrate W being exposed and/or the substrate table WT supporting the substrate. There is relative movement between liquid handling structure 12 and substrate table (and so substrate W). So the position of the droplet on the substrate W or substrate table WT may pass under the liquid handling structure 12 (liquid confinement structure). As the meniscus 90 of the confined liquid is between the liquid handling structure 12 and the substrate W or substrate table WT, the droplet may collide with the meniscus 90. As a result of the collision, a bubble may form in the immersion space 11, causing a defectivity problem.

For example, in a confined immersion system, the droplet may collide with the liquid meniscus 90 which extends between the liquid confinement structure 12 and the substrate W. Such a collision may cause liquid to enclose gas (e.g., air) as a bubble, which may be, for example, 5-10 μm in diameter but may be 1-500 μm in diameter. The bubble may move through the immersion liquid into the space 11 between the projection system PS and the substrate W or the bubble may be stationary on the substrate W and be moved into the space 11 by relative motion between the substrate W and the space 11. A bubble present at this location may affect imaging, i.e. the bubble may be exposed into the resist causing an imaging defect. A bubble, once created, remains substantially stationary with respect to the substrate W or substrate table WT. Hence a defect is caused when the projection system PS projects a beam B onto the bubble.

In particular, a droplet of liquid may be lost when the relative movement between the liquid handling structure 12 and the substrate W or substrate table WT is above a critical scan speed and/or when the liquid handling structure 12 is located over a position between the substrate W and substrate table WT while there is relative movement between the liquid handling structure 12 and the substrate W/substrate table WT. When this droplet collides with the meniscus 90 of the confined immersion liquid, a bubble may be generated at the surface of the substrate W or substrate table WT. The bubble may cause a defect when it crosses the exposure area 64 onto which the projection system PS directs a radiation beam B.

In an embodiment, radially outward of the openings 50 is a continuous gas knife. The continuous gas knife is different from a gas knife arrangement of a droplet controller in that the continuous gas knife blocks encountering droplets traveling in both directions (i.e. radially inwards and radially outwards). In contrast, a gas knife arrangement of a droplet controller is not continuous. The discontinuity allows a droplet to pass through a gas flow of the gas knife arrangement in one direction (i.e. radially outwards). The continuous gas knife comprises an aperture in the undersurface of the liquid handling structure 12. The aperture is connected to an overpressure source. The continuous gas knife may be in the form of a closed figure. During operation gas flow is supplied through the continuous gas knife. The purpose of this continuous gas knife is to help prevent the loss of a liquid droplet from the liquid handling structure 12. Further features related to the provision of the continuous gas knife are described in relation to the arrangement depicted in FIG. 11. These features are applicable to the arrangement depicted in FIG. 6 modified to have the continuous gas knife.

In embodiments of the liquid handling structure 12 that have such a gas knife, immersion liquid may be collected in a region between the openings 50 and the gas knife 111, 61 or 73. This is particularly the case when the liquid handling structure 12 is located over a position between a substrate W and a substrate table WT while there is relative movement between the liquid handling structure 12 and the substrate W/substrate table WT. This collected immersion liquid may then collide with the meniscus 90 when the substrate W/substrate table WT moves in a stepping direction, for example, with respect to a surface of the liquid handling structure 12. In this case, a large bubble may be generated during the stepping movement.

In an embodiment that does not have the gas knife in the form of a closed figure, a droplet of immersion liquid is lost by the liquid handling structure 12. This droplet remains on the substrate W, substrate table WT or other surface. Subsequently, when the scanning direction of the substrate W/substrate table WT is reversed, the lost droplet can collide into the meniscus 90, thereby generating a bubble.

An embodiment of the invention aims to at least partially solve this problem by preventing collision between the meniscus 90 and a droplet of lost immersion liquid. In an embodiment, this is achieved by providing a liquid handling structure 12 with a droplet controller 60. The droplet controller 60 is positioned radially outward of the space 11 in which immersion liquid is confined.

The droplet controller 60 is configured to allow a droplet of immersion liquid to pass from radially inward of the droplet controller 60 to radially outward of the droplet controller 60. A droplet of immersion liquid that escapes from the meniscus 90 is allowed to escape through a gas flow from the droplet controller 60. The droplet controller 60 is further configured to prevent a droplet from passing radially outward of the droplet controller 60 to radially inward of the droplet controller 60. The droplet controller 60 is configured to allow a droplet, that is positioned on the substrate or substrate table, to move (with the substrate or substrate table) away from the meniscus 90 and/or the line of meniscus-pinning openings 50. The droplet controller is configured to prevent a droplet from approaching (and reaching) the meniscus 90.

A droplet that is positioned on the facing surface radially outward of the droplet controller 60 is prevented from colliding with the meniscus 90. The possibility of liquid colliding with the meniscus 90 when the scanning direction is reversed, or during a stepping movement, is reduced. The droplet controller 60 acts as a "diode" gas knife past which a droplet of immersion liquid can pass in one direction only, from radially inward to radially outward. The droplet controller 60 helps prevent liquid from colliding with the meniscus 90 by an arrangement of gas knives 61, 62. The gas knives 61, 62 are arranged to allow liquid to escape. This prevents the liquid from accumulating, which liquid may subsequently collide with the meniscus 90 when, for example, the scanning direction is reversed. The gas knives are arranged to help block an incoming droplet (with respect to the meniscus) from reaching the meniscus 90.

As depicted in FIG. 6, the droplet controller 60 may comprise a plurality of elongate gas outlet openings 61, 62 radially outward of the space 11. The elongate gas outlet openings 61, 62 are configured to direct a gas flow toward the facing surface. Each of the elongate gas outlet openings 61, 62 forms a gas knife opening.

Adjacent pairs of the elongate gas outlet openings 61, 62 overlap when viewed in a stepping direction 120 of the liquid handling structure and/or a scanning direction 110. The scanning direction may be perpendicular to the stepping direction. The purpose of the overlap is to prevent a bubble from forming in the exposure area 64. The overlap has the result that a droplet traveling in the stepping direction 120 is blocked by at least one of the elongate gas outlet openings 61,62. The droplet is prevented from reaching the meniscus 90. The bubble-forming collision is avoided. The droplet is diverted to a part of the substrate W that is not occupied by the exposure area 64.

The elongate gas outlet openings 61, 62 may be arranged in a line of a shape radially outward of the space 11 and the meniscus-pinning openings 50. The shape followed by the elongate gas outlet openings 61, 62 may be the same as the shape followed by the meniscus-pinning openings 50. The shape may be cornered, for example a rhombus. The shape may be a circle, or an ellipse having no corners. The elongate gas outlet openings comprise outer openings 62 and inner openings 61. At a section of the gas knife arrangement of the droplet controller 60, a gap 63 is positioned between two inner openings 61. An outer opening 62 is positioned radially outward of two inner openings 61. The outer opening 62 is positioned radially outward of a gap 63. The outer opening 62 overlaps with the two inner openings 61 when viewed in the scanning direction 110 or stepping direction 120, respectively, depending on whether the section is in the stepping or scanning direction, respectively, from the exposure area 64. In the arrangement depicted in FIG. 6, the shape followed by the droplet controller 60 is a cornered shape. The corners are arranged to point in the scanning and stepping directions 110, 120, with respect to the exposure area 64. The outer opening 62 and the gap 63 may be positioned at a corner of the shape. The combination of an outer opening and two inner openings with an overlapping arrangement may be referred to as a "corner diode". The gap 63 and the fact that the outer opening 62 is radially outer of the inner openings 62 results in the shape defined by the arrangement of the elongate gas outlet openings 61, 62 to differ from the shape of the meniscus 90.

The purpose of the overlapping is that a droplet that approaches the liquid handling structure 12 in either a scanning or a stepping direction is blocked by one of the elongate gas outlet openings 61, 62. This helps prevent collision between the droplet and the meniscus 90, thereby preventing generation of a bubble that can cause a defect. When a collision occurs, a bubble may be formed. The bubble remains stationary with respect to the substrate surface. As the substrate W continues to move with respect to the liquid handling structure 12, the bubble may enter the exposure area 64. This can cause a defect. The purpose of the gap 63 is to allow a droplet to escape from a region radially inward of the droplet controller 60 to a region radially outward of the droplet controller 60. This helps prevent the accumulation of droplets that may later collide with the meniscus 90 when the direction of movement of the liquid handling structure 12 with respect to the facing surface is changed.

The elongate gas outlet openings 61, 62 are desirably connected to the same overpressure source. Alternatively, the gas outlet openings 61, 62 may be connected to separate overpressure sources. This would require a more complicated structure than using a single overpressure source. However, it has an advantage that parameters of the gas flow may be individually varied from gas outlet opening to gas outlet opening. For example, the gas flow rate or gas velocity may be varied.

In an arrangement the outer opening 62 is angled away from the scanning and stepping directions of the liquid handling structure 12. The purpose of this is that the incoming droplet may be deflected by the outer opening 62 with a lower gas force than would be the case if the droplet approached the outer opening 62 in a direction normal to the outer opening 62. The outer opening 62 may be angled (skewed) in either a clockwise or an anticlockwise direction with respect to the scanning or stepping directions. In FIG. 6, the outer opening 62 at the top of the diagram is angled in a clockwise direction of rotation with respect to the scanning direction 110. Each outer opening 62 has two possible directions of skew. Various arrangements are possible corresponding to each permutation of skew direction for each outer opening 62. In an arrangement having four outer openings, there are 16 possible variations, each variation having a different combination of skew directions of the outer openings 62.

The angled (or more correctly skewed) outer opening 62 helps to direct the droplet away from a gap 63 between two adjacent inner openings 61. The droplet is directed in a direction with a component perpendicular from the relative motion between the liquid handling structure 12 and the facing surface (e.g., substrate W/substrate table WT). Therefore as the droplet relatively approaches the meniscus to the immersion space 11, it moves towards the gas knife formed from outer opening 62. Because the outer opening 62 is angled so it is not aligned with the scanning or the stepping direction, the droplet moves along the length of the gas knife. Viewed in a direction perpendicular to the direction of motion, e.g. the scanning direction, the droplet moves in the direction perpendicular to the direction of motion, i.e. in the previous example the stepping direction as shown by arrow 120. In a similar manner that outer opening 62 is skewed, one or more of the inner openings 61 may be skewed.

Figure 7:
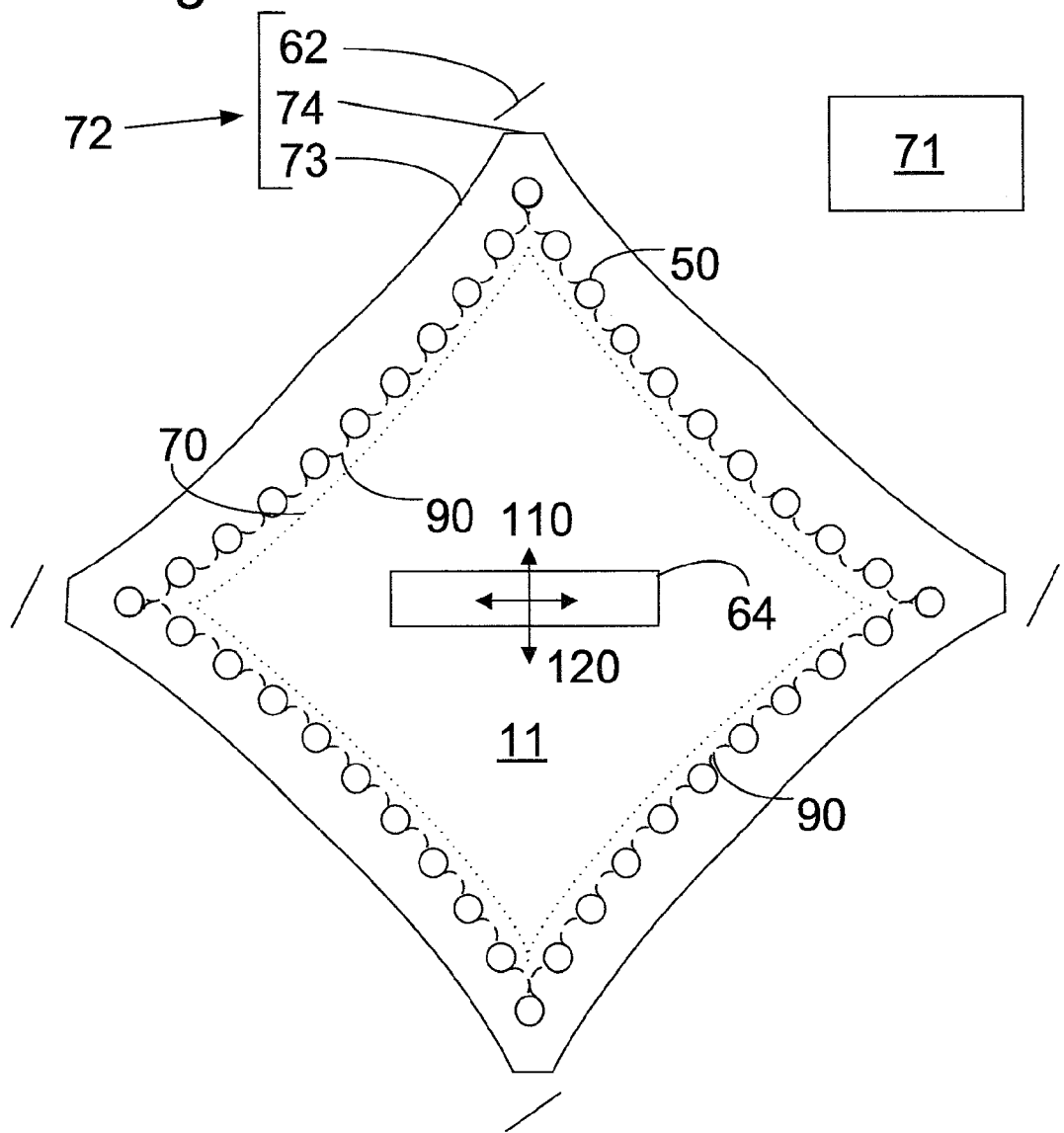
FIG. 7 depicts, in plan, a liquid handling structure according to an embodiment of the invention.

As depicted in FIG. 7, as an alternative to a discontinuous gap 63 between elongate gas outlet openings 61, a droplet controller 72 may instead or additionally have a passing section 74 of a continuous gas outlet opening 73,74. In this case, the passing section 74 is such that a droplet is more likely to pass through a gas flow of the passing section 74 than through a gas flow of other blocking sections 73 of the continuous gas outlet opening. Hence, a droplet may escape through a gas flow of the passing section 74, but would be blocked from reaching the meniscus 90 by the blocking sections 73. In an arrangement, one section of the droplet controller may comprise a gap 63 and another section of the droplet controller may comprise a passing section 74.

In an arrangement, the passing section 74 is effected by a gas outlet opening configured to direct gas flow at an acute angle to a normal to the facing surface. The gas flow is directed toward the facing surface and is angled radially outward. A droplet traveling radially inward is blocked by the gas flow. A droplet traveling radially outward may pass under the gas flow opening. The gas knife providing angled gas flow allows passage of a droplet in one direction only.

The passing section 74 may be effected by, for example, configuring the continuous gas outlet opening to direct a gas flow having a lower flow rate or lower gas velocity through a gas flow of the passing section 74 compared to blocking sections 73. In this case, a controller 71 is configured to control the gas flow through a gas flow of the continuous gas outlet opening (i.e. gas knife) 73,74 such that a flow rate and/or gas velocity through a gas flow of a blocking section 73 of the gas knife is greater than that through a gas flow of a passing section 74. Other features of the embodiment depicted in FIG. 7 are as described above in relation to the embodiment depicted in FIG. 6.

Figure 8:
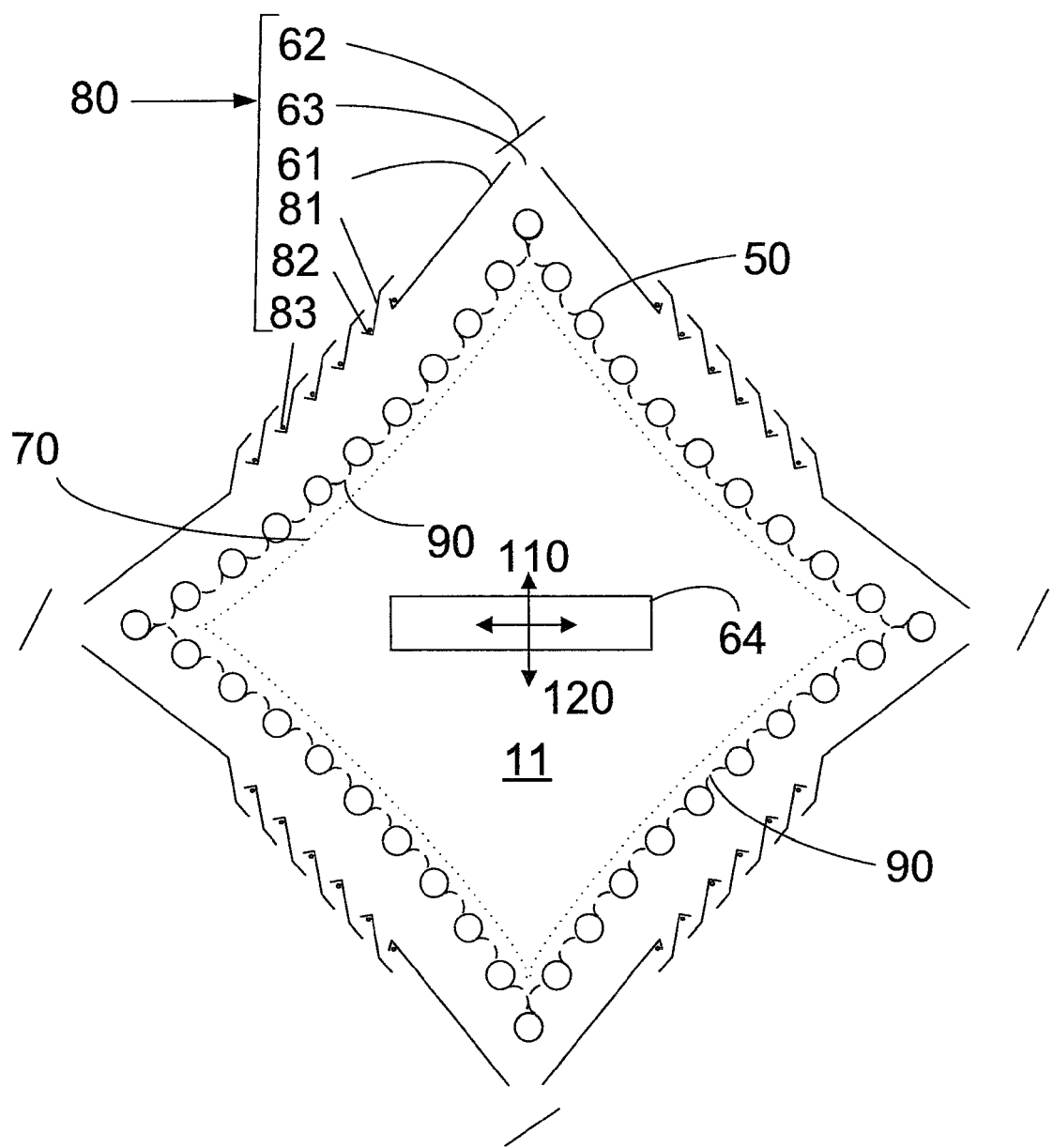
FIG. 8 depicts, in plan, a liquid handling structure according to an embodiment of the invention.

FIG. 8 depicts a further embodiment of the present invention. The embodiment depicted in FIG. 8 may comprise each of the features described above in relation to the embodiments depicted in FIGS. 6 and 7. In addition or alternatively to the "corner diode" gas knife positioned at corners (or other positions) of the shape of the droplet controller 80, the embodiment depicted in FIG. 8 comprises a "side diode" gas knife configuration as described below. The "side diode" gas knife may be used in conjunction with, or as an alternative to, the "corner diode" gas knife. The "corner diode" is effective to control a droplet during linear relative movement between the liquid handling structure 12 and the substrate W and/or substrate table WT.

The "side diode" is effective to control a droplet when the substrate table W and/or substrate table WT turns with respect to the liquid handling structure 12 as well as during linear movements.

As depicted in FIG. 8, the droplet controller 80 may take the form of the plurality of elongate gas outlet openings 61, 62, 81 arranged in a shape radially outward of the meniscus 90. The shape may be cornered, or circular for example. A series of elongate gas outlet openings, which may be referred to as block openings 81 are arranged along a line corresponding to a side of the shape. Adjacent pairs of the block openings 81 overlap when viewed in a stepping direction of the liquid handling structure 12.

The block openings 81 overlap with respect to the stepping direction. This means that if a droplet approaches the droplet controller 80 in the stepping direction, it may encounter one of the block openings 81. This is because a line extending in the stepping direction crosses at least one of the block openings 81 at the droplet controller 80. There are no gaps through which a droplet can pass without encountering one of the block openings 81. The relative movement between the liquid handling structure and the substrate/substrate table may not be limited to two orthogonal directions. When the liquid handling structure reaches the end of a scan, it may turn e.g. in a curved path before the scan direction is reversed. The corner diode and side diode arrangements may be arranged to help prevent a droplet approaching the meniscus during a turning operation from reaching the meniscus 90.

The function of the droplet controller as described above helps prevent a droplet radially outward of the droplet controller 80 from reaching the meniscus 90. In order to help to effect the function of the droplet controller, in addition to the features described above, the block openings 81 have respective directions of elongation that are slanted with respect to a tangent to the line (i.e. the side of the shape) toward the scanning direction.

The block openings 81 in the top left quadrant (i.e. the quadrant between the corner depicted at the top of the diagram and the corner depicted at the left of the diagram) of the liquid handling structure 12 depicted in FIG. 8 are rotated anticlockwise with respect to corresponding sections of the gas outlet openings in FIGS. 6 and 7. The top right quadrant has an arrangement that is substantially symmetrical to the top left quadrant, with the line of symmetry in a vertical line through the center of the liquid handling structure along direction 110. This means that in the top right quadrant of the liquid handling structure 12 depicted in FIG. 8, the block openings 81 forming the "side diode" gas knife are rotated clockwise with respect to the tangent to the line. The bottom half has an arrangement that is substantially symmetrical to the top half with the line of symmetry horizontal through the center of the diagram along direction 120.

The block openings 81 need not be a single straight line. As depicted in FIG. 8, the block openings 81 may comprise at least two sections with an angle therebetween. The block openings 81 may have a curved shape.

By overlapping the block openings 81 with respect to the stepping direction 120, a droplet approaching the block openings 81 in the stepping direction 120 is blocked from reaching the meniscus 90. Desirably the block openings 81 are arranged to overlap when viewed in the scanning direction 120. The purpose of this is to help prevent a droplet approaching from the scanning direction from passing through gaps between adjacent block openings 81.

If a droplet of immersion liquid approaches one of the block openings 81 of the droplet controller 80 depicted in FIG. 8 from above the Figure, the block opening 81 will deflect the droplet away from the centerline through the Figure (i.e. away from the center of the liquid handling structure 12). However, the droplet will pass radially inward of the adjacent block opening 81. Hence, due to the direction of slanting of the block openings 81, a droplet may pass between adjacent block openings 81.

In order to help prevent the droplet from reaching the meniscus 90, a separate part 82 or alternatively a separate gas outlet opening 82 is provided. This gas outlet opening 82 may be termed a trap opening 82. The trap opening 82 extends from a radially inward end of a respective block opening 81 at an angle. This angle (or direction) is desirably between the stepping direction of the liquid handling structure 12 and the principal direction of elongation of the respective block opening 81. The trap opening 82 provides a gas flow which is a barrier for a droplet moving along the block opening 81. As a result, the droplet is accumulated at the junction between the block opening 81 and the trap opening 82.

In an embodiment, an extractor 83 is positioned at an inner side of an intersection (junction) between the block opening 81 and the trap opening 82. This extractor 83 is configured to extract at least part of the liquid droplet collected at the intersection. This helps prevent the intersection from overflowing, which could otherwise result in an overflow of liquid reaching radially inward of the droplet controller 80 and colliding with the meniscus 90.

The block openings 81 need not necessarily overlap with respect to both a scanning direction 110 and a stepping direction 120. In the case that there are gaps between block openings 81 in either the scanning direction 110 or the stepping direction 120, desirably the droplet controller 80 comprises an extraction opening (not shown in FIG. 8) lined up with the respective gap(s), with respect to either the scanning direction or the stepping direction. The purpose of this is that any liquid droplet that passes through a gap between block openings 81 of the droplet controller 80 is extracted before reaching the meniscus 90. The block openings 81 may overlap when viewed in a direction halfway between the scanning direction 110 and stepping direction 120. The purpose of this arrangement is to block any droplet approaching in a direction between the scanning and stepping directions. This is effective to help prevent a droplet from reaching the meniscus 90 during a turning operation during which the relative movement between the liquid handling structure and the substrate/substrate table may be in a direction between the scanning and stepping directions 110, 120.

Figure 9:
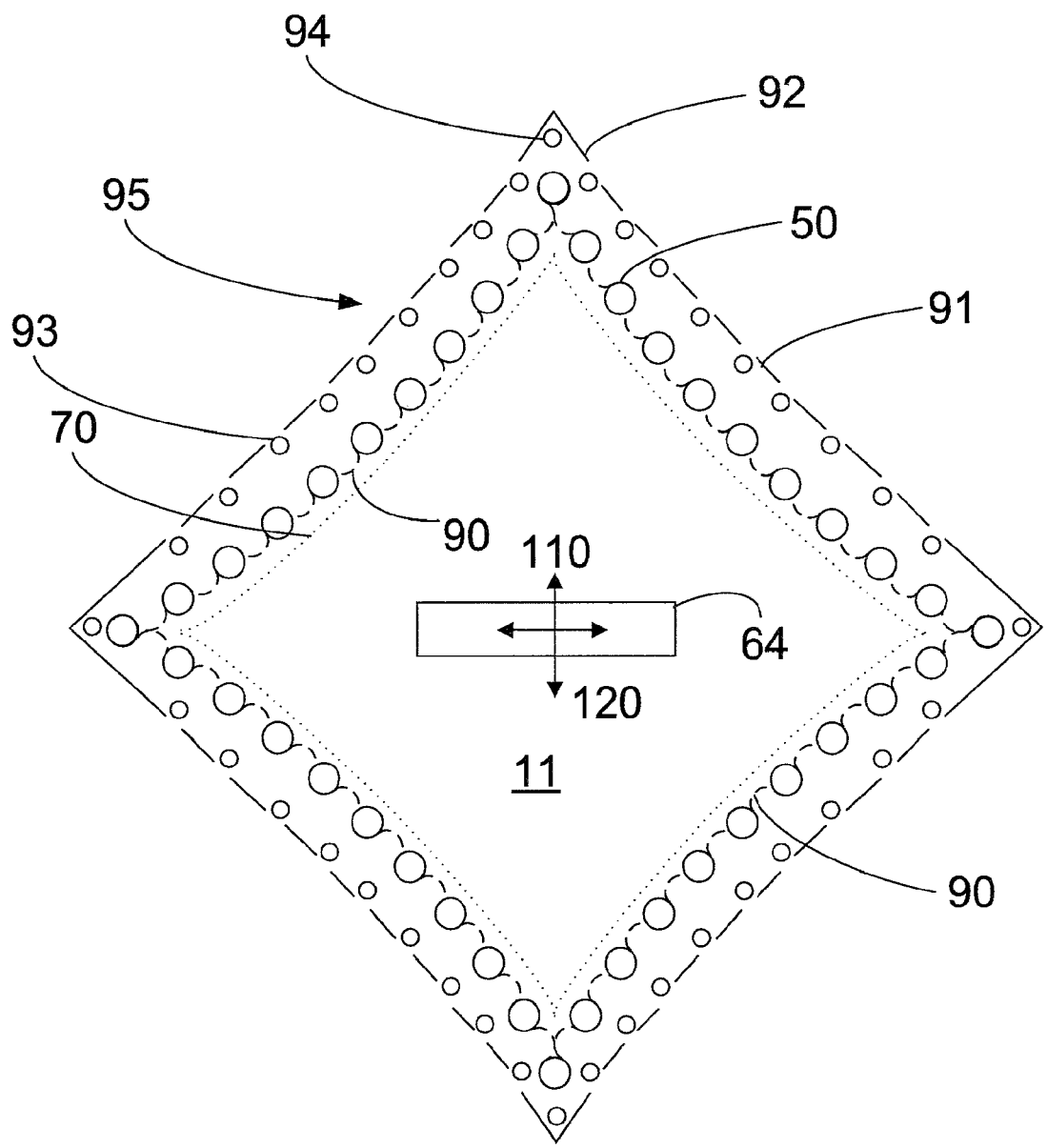
FIG. 9 depicts, in plan, a liquid handling structure according to an embodiment of the invention.

FIG. 9 depicts an embodiment of the invention which features gaps, as mentioned above, between blocking sections of a gas knife 91, 92 and extractor 93. The idea behind this embodiment is that the probability of a bubble being produced from a collision between a droplet and the meniscus 90 is reduced by extracting as much of the droplet as possible before the collision.

In the embodiment depicted in FIG. 9, the droplet controller 95 radially outward of the space 11 comprises a plurality of elongate gas outlet openings 91, 92 and a plurality of liquid extraction openings 93. The droplet controller 95 is positioned radially outward of the meniscus 90. The liquid extraction openings 93 are lined up, with respect to a scanning direction of the liquid handling structure, with respective gaps between adjacent elongate gas outlet openings 91, 92. Additionally or alternatively, the liquid extraction openings 93 may be lined up with the gaps with respect to the stepping direction of the liquid handling structure 12. The liquid extraction openings 93 are in connection to an under pressure source. The openings 93 may be connected to the same under pressure source, or separate under pressure sources.

In the embodiment depicted in FIG. 9, the liquid extraction openings 93 are positioned radially inward of the elongate gas outlet openings 91, 92. In an embodiment, the liquid extraction openings are, alternatively or additionally, positioned radially outward of the elongate gas outlet openings 91, 92. Radially outward liquid extraction openings are particularly advantageous for the receding side of the liquid handling structure 12. That is, when a droplet radially inward of the droplet controller 95 is moving in a direction radially outward, it is blocked by one of the elongate gas outlet openings 91, 92. As a result, the droplet is guided towards one of the gaps between the elongate gas outlet openings 91, 92. In this case, it is desirable that there is a liquid extraction opening 93 lined up, with respect to the direction of motion of the liquid handling structure 12 (i.e. scanning direction or stepping direction), with the gaps. This allows at least part of the droplet to be extracted through the liquid extraction opening, thereby leaving no droplet or a smaller droplet on the facing surface.

In an embodiment, a liquid extraction opening 93 is positioned both radially inward and radially outward of the elongate gas outlet openings 91, 92.

In an embodiment, a liquid extraction opening 93 is not provided in addition to the meniscus pinning openings 50. In this embodiment, the meniscus pinning openings 50 are lined up with the gaps between adjacent elongate gas outlet openings 91, 92, with respect to the direction of relative movement between the liquid handling structure 12 and the facing surface. The purpose of this is that if a droplet collides with the meniscus 90 at a meniscus pinning opening 50, the probability of bubble creation is reduced compared to the situation where a droplet collides with the meniscus 90 between meniscus pinning openings 50. In this embodiment, a radially outer edge of the meniscus pinning openings 50 is comprised in the droplet controller 95. In an embodiment the meniscus pinning openings 50 are a part of the droplet controller 95.

Desirably, the elongate gas outlet openings 91, 92 are arranged in the form of a cornered shape radially outward of the space 11. In an embodiment, at corners of the cornered shape, there is provided a continuous blocking section of gas outlet opening 92 such that there is no gap at the corners. In other words, at a corner of the shape, a liquid extraction opening is positioned radially inward of a V-shaped gas outlet opening with a point of the V-shaped gas outlet opening pointing radially outwards.

In this embodiment, a droplet radially inward of the droplet controller 95 may be guided towards the corners of the cornered shape. Desirably, a liquid extraction opening that is in contact with a meniscus of the confined immersion liquid is in line with the point of the V-shaped gas outlet opening with respect to a scanning direction of the liquid handling structure. The liquid extraction opening 94 is configured to extract at least part of the liquid droplet or droplets that collect at the corner.

Desirably, the corner of the cornered shape is aligned, with respect to a scanning or stepping direction, with a meniscus pinning extraction opening 50. If the direction of relative movement between the liquid handling structure 12 and the facing surface reverses, the remaining liquid collected at the corner collides with the meniscus 90 at that meniscus pinning extraction opening 50. As a result, the probability of bubble production is reduced.

FIG. 10 depicts part of a modified embodiment of that depicted in FIG. 9. In FIG. 10 there is provided a series of diverting gas outlet openings 101. These diverting gas outlet openings 101 are arranged such that adjacent pairs within the series overlap when viewed in a scanning direction 110 of the liquid handling structure. In an embodiment, adjacent pairs of the diverting gas outlet openings 101 overlap when viewed in the stepping direction 110. The diverting gas outlet openings 101 deflect any residual droplet that has passed through gaps between elongate gas outlet openings 91, 92 and has not been fully extracted by liquid extraction openings 93 away from the critical area within the space 11. The critical area is the region that is to be exposed by radiation directed from the projection system PS. This region is critical because it is when bubbles resulting from a droplet that collides with the meniscus 90 are exposed by radiation that defects occur.

Desirably the series of diverting gas outlet openings 101 are arranged along a line and respective directions of elongation of the diverting gas outlet openings 101 are slanted with respect to a tangent to the line toward the direction 120 perpendicular to the scanning direction. The gas outlet openings 91, 101 are desirably comprised of two sections 102, 103. A first section 102 is angled with respect to a second section 103. The purpose of the second section is to produce an overlap with an adjacent gas outlet opening when viewed in the stepping direction 120. The purpose of the first section is to divert an incoming liquid droplet to an adjacent gas outlet opening or to an extraction hole without allowing the liquid droplet to reach the meniscus.

With increasing length of elongate gas outlet openings, the probability that an encountering droplet will pass through a gas flow of the elongate gas outlet opening increases. For this reason, it is desirable to use a series of diverting gas outlet openings 101 rather than a single continuous section of gas outlet opening.

As described above in relation to the embodiments depicted in FIGS. 6 to 10, discrete gas outlet openings (e.g., gas knives) may be used to block an incoming droplet while allowing an outgoing droplet to escape through a gap or a passing section. Additionally or alternatively, an extraction opening lined up with a gap between discrete gas outlet openings may be used to extract a droplet (either incoming or outgoing). These two principles may be combined in any embodiment.

For example, gas outlet openings may be arranged such that adjacent pairs overlap in the scanning direction 110 or the stepping direction 120, with a liquid extraction opening lined up with a gap between gas outlet openings, with respect to the other of the scanning direction or the stepping direction.

Any of the embodiments described above may be modified by incorporating a continuous gas outlet opening in the form of a closed figure radially outward of the space 11. For example, FIG. 11 depicts a modified version of the embodiment depicted in FIG. 8, having such a surrounding gas outlet opening 111. The continuous gas outlet opening 111 may be radially inward of the elongate gas outlet openings 61, 81. Alternatively or additionally, as depicted in FIG. 11, the continuous gas outlet opening 111 may be radially outward of the elongate gas outlet openings 61, 81. The continuous gas outlet opening 111 may be connected to the same, or different, under pressure source to that connected to the elongate gas outlet openings 61, 81.

Liquid passes from the space 11 into the openings 50. The openings 50 may be designed so that two phase extraction (i.e. gas and liquid) occurs in an annular flow mode. In annular flow mode gas may substantially flow through the center of the openings 50 and liquid may substantially flow along the wall(s) of the openings 50. A smooth flow with low generation of pulsations results.

Figure 12:
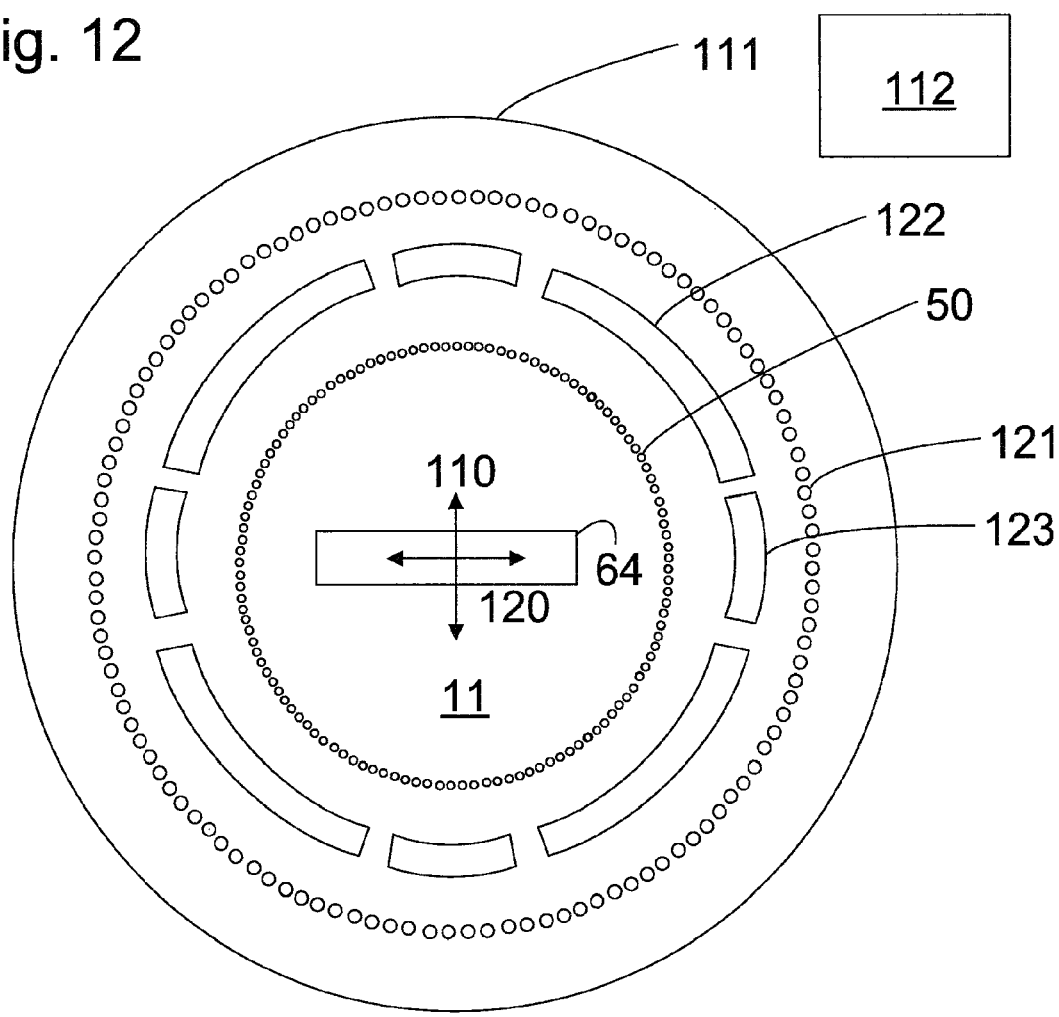
FIG. 12 depicts, in plan, a liquid handling structure according to an embodiment of the invention.

In FIG. 11, the meniscus-pinning openings 50 are arranged in a rectilinear shape. FIG. 12 depicts an arrangement in which the meniscus-pinning openings 50 are arranged in a circle. In this case, the gas outlet openings of the droplet controller may be arranged in a circle radially outward of the meniscus-pinning openings 50 and radially outward of the space 11. In FIG. 12, the individual gas outlet openings of the droplet controller 122, 123 are not shown. The droplet controller comprises a side diode section 122 and a corner diode section 123. The side diode 122 and the corner diode 123 may take the form as described above in relation to any of the other embodiments. In an embodiment, the droplet controller may comprise only a side diode 122, only a corner diode 123, or a combination of a side diode 122 and a corner diode 123. There may be at least two side diode sections and/or corner diode sections. In FIG. 12, there are four side diodes 122 and four corner diodes 123.

As depicted in FIG. 12, the outer gas outlet opening 111 may take the form of a circle. Desirably, there is a plurality of outer extractors 121 to extract liquid positioned between the gas outlet openings of the droplet controller and the outer gas outlet opening 111. The outer extractors 121 may be two-phase extractors to extract liquid and gas. The outer extractors 121 may be arranged in a circle. The outer extractors 121 may extract at least some of a liquid droplet that is positioned radially outward of the droplet controller 122, 123 and radially inward of the outer gas outlet opening 111. Such a droplet may have been allowed to escape from radially inward of the droplet controller 122, 123 and trapped by the outer gas outlet opening 111. By at least partially extracting the droplet, the possibility of the droplet colliding with the meniscus, when for example the scanning direction is changed, is reduced.

The embodiments described above may be implemented on a so-called dual-stage lithographic apparatus. In some dual-stage lithographic apparatuses a droplet or droplets of immersion liquid may be collected by a surrounding gas knife (which is intentional to prevent liquid loss). The collected droplet or droplets can subsequently collide with the meniscus 90. According to an embodiment of the invention, such a droplet is either allowed to escape from under the liquid handling structure 12 in a controlled fashion, and/or is extracted via liquid extraction openings 93. For example, in FIG. 6, an angled gas knife 62 is positioned radially outward of a gap between two further gas knives 61 to block an incoming droplet. In such gas outlet openings (or gas knives) as described above, a relatively large over pressure is required to block a droplet of immersion liquid.

Any of the embodiments of the invention may comprise a controller to control gas flow through the gas outlet openings of the liquid handling structure 12. Such a controller 112 is depicted in FIG. 11. The controller may be configured to control the gas flow from the elongate gas outlet openings 61, 81 toward the facing surface based on a position of the facing surface relative to the liquid handling structure 12. Additionally or alternatively, the controller 112 may control the gas flow based on the direction or speed of relative movement between the liquid handling structure 12 and the facing surface.

In particular, the controller 112 may be configured to control the gas outlet openings such that gas flow is directed from a gas outlet opening when the respective gas outlet opening is located over a position between the substrate W and the substrate table WT. When the gas outlet opening is not located between the substrate W and the substrate table WT it may be switched off by the controller 112. The purpose of this is that immersion liquid loss from the meniscus 90 is particularly likely when the liquid handling structure is located over a position between the substrate W and the substrate table WT. Hence, the period of time corresponding to the cross over from the substrate W to the substrate table WT, or vice versa, may be significant to preventing a droplet from colliding with the meniscus 90.

In an embodiment, there is provided an immersion lithographic apparatus comprising a liquid handling structure and a droplet controller. The liquid handling structure is configured to supply and confine immersion liquid to a space between a projection system and a facing surface comprising a table, or a substrate supported by the table, or both the table and the substrate. The droplet controller is radially outward of the space configured to allow a droplet of immersion liquid to pass from radially inward of the droplet controller to radially outward of the droplet controller. The droplet controller further is to prevent a droplet from passing from radially outward of the droplet controller to radially inward of the droplet controller.

The droplet controller may comprise a plurality of elongate gas outlet openings configured to direct a gas flow toward the facing surface.

In an embodiment there is provided an immersion lithographic apparatus comprising a liquid handling structure and a plurality of elongate gas outlet openings. The liquid handling structure is configured to supply and confine immersion liquid to a space between a projection system and a facing surface comprising a table, or a substrate supported by the table, or both the table and the substrate. The plurality of elongate gas outlet openings are radially outward of the space configured to direct a gas flow toward the facing surface. An adjacent pair of the elongate gas outlet openings overlaps when viewed in a scanning direction of the facing surface and/or when viewed in a direction perpendicular to the scanning direction.

The immersion lithographic apparatus may further comprise a liquid extraction opening lined up, when viewed from a scanning direction of the facing surface, with a respective gap between adjacent elongate gas outlet openings.

In an embodiment there is provided an immersion lithographic apparatus comprising a liquid handling structure and a droplet controller. The liquid handling structure is configured to supply and confine immersion liquid to a space between a projection system and a facing surface comprising a table, or a substrate supported by the table, or both the table and the substrate. The droplet controller is radially outward of the space and comprises a plurality of elongate gas outlet openings and a plurality of liquid extraction openings. The plurality of elongate gas outlet openings configured to direct a gas flow toward the facing surface. The plurality of liquid extraction openings are lined up, with respect to a scanning direction and/or a stepping direction of the facing structure, with a respective gap between adjacent elongate gas outlet openings.

At least one of the plurality of liquid extraction openings may be positioned between a meniscus of the confined immersion liquid and the elongate gas outlet openings. At least one of the plurality of liquid extraction openings may be positioned radially outward of the elongate gas outlet openings. At least one of the plurality of liquid extraction openings may be arranged to confine the immersion liquid in the space.

An adjacent pair of the elongate gas outlet openings may overlap when viewed in a scanning direction of the facing surface.

The elongate gas outlet openings may be arranged in a line and a direction of elongation of at least one elongate gas outlet opening is slanted with respect to a tangent to the line at the respective elongate gas outlet opening toward a scanning direction of the facing surface.

The immersion lithographic apparatus may further comprise a trapping gas outlet opening. The opening may extend from a radially inward end of a respective elongate gas outlet opening at an angle between a direction perpendicular to a scanning direction of the facing surface and a direction of elongation of the respective elongate gas outlet opening.

The immersion lithographic apparatus may further comprise a series of diverting gas outlet openings arranged such that an adjacent pair within the series of diverting gas outlet openings overlap when viewed in a direction perpendicular to a scanning direction of the facing surface. The series of diverting gas outlet openings may be arranged along a line. The respective directions of elongation of the diverting gas outlet openings may be slanted with respect to a tangent to the line at the respective diverting gas outlet opening toward the direction perpendicular to the scanning direction.

The elongate gas outlet openings may be arranged in a line of a cornered shape radially outward of the space. At a corner of the shape, a liquid extraction opening may be positioned radially inward of a V-shaped gas outlet opening with a point of the V-shaped gas outlet opening pointing radially outwards.

A liquid extraction opening that is in contact with a meniscus of the confined immersion liquid may be in line with the point of the V-shaped gas outlet opening with respect to a scanning direction of the facing surface.

The elongate gas outlet openings may be arranged in a line of a cornered shape radially outward of the space. At a corner of the shape, at least one of the elongate gas outlet openings may be positioned radially outward of a gap between two of the elongate gas outlet openings. It may overlap with the two of the elongate gas outlet openings when viewed in a direction perpendicular to a scanning or stepping direction of the facing surface.

The at least one of the elongate gas outlet openings may be non-perpendicular to the scanning or stepping direction.

The immersion lithographic apparatus may further comprise a controller configured to control the gas flow from the elongate gas outlet openings toward the facing surface based on a position and/or movement of the facing surface relative to the liquid handling structure.

The elongate gas outlet openings may be configured to direct gas flow at an acute angle to a normal to the facing surface.

The liquid handling structure may comprise a continuous gas outlet opening in the form of a closed figure configured to direct a gas flow toward the facing surface radially outward of the space.

The continuous gas outlet opening may be radially inward of the elongate gas outlet openings. The continuous gas outlet opening may be radially outward of the elongate gas outlet openings.

In an embodiment there is provided a method of manufacturing a device using a lithographic apparatus. The method comprises confining liquid using a confinement structure in a space between a projection system and a facing surface of a table, a substrate supported by the table, or both the table and the substrate. The method further comprises moving the facing surface relative to the projection system in a scanning direction. The method further comprises manipulating a droplet of immersion liquid by allowing the droplet to pass from radially inward of a droplet controller to radially outward of the droplet controller. The droplet controller may be radially outward of the space. The method further comprises preventing the droplet from passing from radially outward of the droplet controller to radially inward of the droplet controller.

In an embodiment there is provided a method of manufacturing a device using a lithographic apparatus. The method comprises confining liquid using a confinement structure in a space between a projection system and a facing surface of a table, a substrate supported by the table, or both the table and the substrate. The method further comprises moving the facing surface relative to the projection system in a scanning direction. The method further comprises directing a gas flow toward the facing surface through a plurality of elongate gas outlet openings radially outward of the space. An adjacent pair of the elongate gas outlet openings may overlap when viewed in the scanning direction of the facing surface and/or when viewed in a direction perpendicular to the scanning direction.

In an embodiment there is provided a method of manufacturing a device using a lithographic apparatus. The method comprises confining liquid using a confinement structure in a space between a projection system and a facing surface of a table, a substrate supported by the table, or both the table and the substrate. The method further comprises moving the facing surface relative to the projection system in a scanning direction. The method further comprises manipulating a droplet of immersion liquid by directing a gas flow toward the facing surface from a plurality of elongate gas outlet openings having a gap between them. The method further comprises extracting at least a part of the droplet through a plurality of liquid extraction openings. Each liquid extraction opening may be lined up, with respect to the scanning direction, with a respective gap between adjacent elongate gas outlet openings.

In an embodiment there is provided a liquid handling structure configured to supply and confine immersion liquid to a space between a projection system and a facing surface comprising a table, or a substrate supported by the table, or both the table and the substrate. The liquid handling structure comprises a droplet controller radially outward of the space configured to allow a droplet of immersion liquid to pass from radially inward of the droplet controller to radially outward of the droplet controller and to prevent a droplet from passing from radially outward of the droplet controller to radially inward of the droplet controller.

In an embodiment there is provided a liquid handling structure configured to supply and confine immersion liquid to a space between a projection system and a facing surface comprising a table, or a substrate supported by the table, or both the table and the substrate. The liquid handling structure comprises a plurality of elongate gas outlet openings radially outward of the space configured to direct a gas flow toward the facing surface. An adjacent pair of the elongate gas outlet openings may overlap when viewed in a scanning direction of the facing surface and/or when viewed in a direction perpendicular to the scanning direction.

In an embodiment there is provided a liquid handling structure configured to supply and confine immersion liquid to a space between a projection system and a facing surface comprising a table, or a substrate supported by the table, or both the table and the substrate. The liquid handling structure may comprise a droplet controller radially outward of the space. The droplet controller may comprise a plurality of elongate gas outlet openings and a plurality of liquid extraction openings. The plurality of elongate gas outlet openings are configured to direct a gas flow toward the facing surface. Each liquid extraction opening is lined up, with respect to a scanning direction and/or a stepping direction of the facing surface, with a respective gap between adjacent elongate gas outlet openings.

In an embodiment there is provided a fluid handling structure for an immersion lithographic apparatus. The fluid handling structure is configured to supply and confine immersion liquid to a space between a projection system and a facing surface comprising a table, or a substrate supported by the table, or both the table and the substrate. The liquid may form a meniscus between a surface of the fluid handling structure and the facing surface. The fluid handling structure may comprise a droplet controller to prevent liquid on the facing surface from reaching the meniscus.

As will be appreciated, any of the above described features can be used with any other feature and it is not only those combinations explicitly described which are covered in this application. Further, references herein to a droplet may include a liquid film.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components. Throughout the description, reference has been made to a stepping direction and a scanning direction. The scanning and stepping direction as referred to in the description are principal orthogonal axes. While in a preferred embodiment, these principal axes may be aligned with the scanning and stepping directions, in other embodiments they may be independent of the scanning and stepping directions.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a liquid handling structure) or an outlet out of the immersion space (or an inlet into the liquid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. An immersion lithographic apparatus comprising:
   a liquid handling structure configured to supply and confine immersion liquid to a space between a projection system and a facing surface comprising a table, or a substrate supported by the table, or both the table and the substrate; and
   a droplet controller radially outward of the space configured to allow a droplet of immersion liquid to pass from radially inward of the droplet controller to radially outward of the droplet controller and to prevent a droplet from passing from radially outward of the droplet controller to radially inward of the droplet controller.

2. The immersion lithographic apparatus of claim 1, wherein the droplet controller comprises a plurality of elongate gas outlet openings configured to direct a gas flow toward the facing surface.

3. The immersion lithographic apparatus of claim 2, further comprising a liquid extraction opening lined up, when viewed from a scanning direction of the facing surface, with a respective gap between adjacent elongate gas outlet openings.

4. The immersion lithographic apparatus of claim 3, wherein at least one of the plurality of liquid extraction openings is positioned between a meniscus of the confined immersion liquid and the elongate gas outlet openings.

5. The immersion lithographic apparatus of claim 3, wherein at least one of the plurality of liquid extraction openings is positioned radially outward of the elongate gas outlet openings.

6. The immersion lithographic apparatus of claim 2, wherein an adjacent pair of the elongate gas outlet openings overlap when viewed in a scanning direction of the facing surface.

7. The immersion lithographic apparatus of claim 2, further comprising a trapping gas outlet opening extending from a radially inward end of a respective elongate gas outlet opening at an angle between a direction perpendicular to a scanning direction of the facing surface and a direction of elongation of the respective elongate gas outlet opening.

8. The immersion lithographic apparatus of claim 2, further comprising a series of diverting gas outlet openings arranged such that an adjacent pair within the series of diverting gas outlet openings overlap when viewed in a direction perpendicular to a scanning direction of the facing surface.

9. The immersion lithographic apparatus of claim 2, wherein the elongate gas outlet openings are arranged in a line of a cornered shape radially outward of the space, wherein at a corner of the shape, a liquid extraction opening is positioned radially inward of a V-shaped gas outlet opening with a point of the V-shaped gas outlet opening pointing radially outwards.

10. The immersion lithographic apparatus of claim 2, wherein the elongate gas outlet openings are arranged in a line of a cornered shape radially outward of the space, wherein at a corner of the shape, at least one of the elongate gas outlet openings is positioned radially outward of a gap between two of the elongate gas outlet openings, and overlaps with the two of the elongate gas outlet openings when viewed in a direction perpendicular to a scanning or stepping direction of the facing surface.

11. The immersion lithographic apparatus of claim 2, further comprising a controller configured to control the gas flow from the elongate gas outlet openings toward the facing surface based on a position and/or movement of the facing surface relative to the liquid handling structure.

12. The immersion lithographic apparatus of claim 2, wherein the elongate gas outlet openings are configured to direct gas flow at an acute angle to a normal to the facing surface.

13. The immersion lithographic apparatus of claim 2, wherein the liquid handling structure comprises a continuous gas outlet opening in the form of a closed figure configured to direct a gas flow toward the facing surface radially outward of the space.

14. A method of manufacturing a device using a lithographic apparatus, the method comprising:
   confining liquid using a confinement structure in a space between a projection system and a facing surface of a table, a substrate supported by the table, or both the table and the substrate;
   moving the facing surface relative to the projection system in a scanning direction; and
   manipulating a droplet of immersion liquid by:
      allowing the droplet to pass from radially inward of a droplet controller to radially outward of the droplet controller, wherein the droplet controller is radially outward of the space; and
      preventing the droplet from passing from radially outward of the droplet controller to radially inward of the droplet controller.

15. A liquid handling structure configured to supply and confine immersion liquid to a space between a projection system and a facing surface comprising a table, or a substrate supported by the table, or both the table and the substrate, the liquid handling structure comprising a droplet controller radially outward of the space configured to allow a droplet of immersion liquid to pass from radially inward of the droplet controller to radially outward of the droplet controller and to prevent a droplet from passing from radially outward of the droplet controller to radially inward of the droplet controller.

* * * * *